United States Patent [19]
Rajavel et al.

[11] Patent Number: 5,976,958
[45] Date of Patent: Nov. 2, 1999

[54] METHOD FOR GROWTH OF IN SITU P-TYPE SEMICONDUCTOR FILMS USING A GROUP V FLUX

[75] Inventors: Rajesh D. Rajavel, Agoura; Owen K. Wu; Peter D. Brewer, both of Westlake Village; Terence J. deLyon, Newbury Park, all of Calif.

[73] Assignee: Hughes Electronics Corporation, El Segundo, Calif.

[21] Appl. No.: 08/965,390

[22] Filed: Nov. 6, 1997

[51] Int. Cl.$^6$ ..................................................... H01L 21/20
[52] U.S. Cl. ............................ 438/478; 438/46; 117/102; 117/103; 117/108
[58] Field of Search ................................ 438/478, 46, 47; 117/102, 103, 108; 118/724

[56] References Cited

PUBLICATIONS

G. Davies et al., III–V MBE Growth Systems, in The Technology and Physics of Molecular Beam Epitaxy, edited by E.H.C. Parker, Plenum Press, New York. Sep. 1985.

Lugauer et al., "Generation of atomic group V materials for the p–type doping of wide gap II–VI semiconductors using a novel plasma cracker," Journal of Crystal Growth 161, pp. 86–89. Apr. 1996.

Furdyna, J.K., "Diluted magnetic semiconductors: Issues and opportunities" Dept. of Physics, Purdue University; J. Vac. Sci. Technol. A4 (4) pp. 2002–2009.

Garcia, J.C., et al. "Dimer magnetic arsenic source using a high efficiency catalytic cracking oven for molecular beam epitaxy" Appl. Phys. Lett. 51(8) pp. 593–595 (1987).

Wamsley, et al., "Solid source molecular beam apitaxy of GaInAsP/InP: Growth mechanisms and machine operation" J. Vac. Sci. Technol. B 14(3) pp. 2322–2324 (1996).

Stanley, C.R., et al., "Peak electron mobilities between 2.75 and $3.32\times10^5$ cm$^2$ V$^1$ s$^{-1}$ in GaAs grown by molecular beam epitaxy with As$_2$ " Appl. Phys. Lett. 57(19) pp. 1992–1994 (1990).

Brewer, P.D., et al. "Atomic antimony for molecular beam epitaxy of high quality III–V semiconductor alloyws" J. Vac. Sci. Technol. B 14(3) pp. 2335–2338 (1996).

*Primary Examiner*—Charles Bowers
*Assistant Examiner*—Keith Christianson
*Attorney, Agent, or Firm*—V. D. Duraiswamy; M. W. Sales

[57] ABSTRACT

A method of growing a p-type doped Group II-VI semiconductor film includes the steps of forming a lattice comprising a Group II material and a Group VI material and generating a first Group V flux by evaporating a solid Group V source material. The first Group V flux is then decomposed to generate a second Group V flux, which is, in turn, provided to the lattice to p-type dope the growing film. The Group V source material may by arsenic such that the second Group V flux may predominantly include dimeric arsenic decomposed from tetrameric arsenic to improve the incorporation of arsenic into the Group VI sublattice of the lattice.

19 Claims, 7 Drawing Sheets

METHOD FOR GROWTH OF IN SITU P-TYPE SEMICONDUCTOR FILMS USING A GROUP V FLUX

BACKGROUND OF THE INVENTION

1. Field of the Invention

The invention relates generally to the growth of Group II-VI semiconductor films for use in infrared detection devices and, more particularly, to the in situ growth of p-type doped Group II-VI semiconductor films using Group V dopants.

2. Description of the Related Art

The formation of p-type layers in Group II-VI semiconductor structures is critical to the production of heterojunction, multileveled structures for use in infrared ("IR") detectors. While suitable n-type doping techniques are known, present p-type doping techniques for Group II-VI semiconductors, such as HgCdTe alloys, leave significant room for improvement.

Molecular beam epitaxy ("MBE"), a vacuum deposition process, is a typical method of preparing HgCdTe alloys. A conventional MBE process for the growth of an HgCdTe alloy is described in J. P. Faurie et al., "Molecular Beam Epitaxy of II-VI Compounds: $Cd_xHg_{1-x}Te$," *J. Cryst. Growth,* Vol. 54, No. 3, pp. 582–585 (1981), the disclosure of which is incorporated herein by reference. MBE growth processes provide for in situ growth of high quality epilayers and abrupt heterojunctions, each of which is desirable for the construction of high performance IR detectors. Such in situ growth processes also advantageously produce multilayer devices in a single growth run.

U.S. Pat. No. 5,028,561 (assigned to the assignee of the present application) discloses an MBE process for growing a p-type HgCdTe film utilizing a dopant flux generated from an $X_3Y_2$ compound, where X is a Group II element such as cadmium (Cd) and Y is a Group V element such as arsenic (As). Such a dopant flux provides sufficient Group II element to occupy metal (usually mercury (Hg)) vacancies in the Group II sublattice, thereby leaving the Group V dopant (arsenic) available to enter the Group VI sublattice to achieve p-type doping.

Providing both the Group II element and the Group V element is necessary because the Group V element (arsenic) is amphoteric in Group II-VI semiconductors such as HgCdTe and ZnSe. The arsenic could, therefore, dope the growing layer n-type by occupying the metal vacancies rather than entering the Group VI sublattice.

However, the preferred $X_3Y_2$ compound in the aforementioned process, $Cd_3As_2$, is very difficult to obtain in high purities. To achieve a suitable purity level of, for instance, 99.99999%, additional costly and potentially ineffectual purification steps must be performed. Without sufficient purification, impurities such as organic compounds and/or water vapor left in the flux may compensate the p-type dopants to a potentially large extent.

Other techniques used to p-type dope Group II-VI semiconductor films have been found undesirable. For example, ion implantation techniques generally cause too much damage to the lattice, thereby requiring significant repair efforts involving relatively high temperature annealing that destroys the heterojunction interfaces. For this reason, these techniques are not readily applied to the fabrication of n-p-n multilayer structures. Moreover, devices fabricated by ion implantation techniques may have significantly reduced minority carrier lifetimes due to lingering effects created from the implant.

Another approach to growing p-type doped HgCdTe films involves an interdiffused superlattice process ("ISP"), which includes the growth of a p-type HgTe/CdTe superlattice structure wherein the CdTe layer is doped with arsenic. In this process, a high temperature anneal (at about 450° C.) under mercury overpressure creates an HgCdTe epilayer through interdiffusion. The high temperature anneal is followed by a mercury vacancy anneal at a comparatively low temperature (about 250° C.). Suitable p-type doping of the epilayer is accomplished by doping the CdTe layer.

However, devices constructed through the ISP process have encountered several problems believed to be based on the following structural defects. First, the arsenic may not be uniformly distributed after the high temperature anneal. Furthermore, the high temperature anneal typically destroys the p-n junction interface, thereby rendering it difficult to control the precise junction location. Finally, the quality of the superlattice and the ensuing homogeneous layer may be compromised due to differences in the optimal growth temperatures of the individual layers.

Group II-VI semiconductor films such as ZnSe have been p-doped using an active nitrogen beam generated by a free-radical source. Radio-frequency (rf) energy is used to convert nitrogen gas ($N_2$) into a nitrogen plasma, which is then supplied to an MBE chamber coupled to the free-radical source. The use of nitrogen ($N_2$), however, is undesirable because the operation of the free-radical source may introduce contaminants into the dopant flux. For example, typical plasma generation processes require a supply of nitrogen and, possibly, a supply of an inert gas, such as argon, to first ignite the plasma. Both of these gases are likely to have traces of oxygen and water vapor therein.

Generating nitrogen plasma for p-type doping is undesirable for the additional reason that controlling the activation of nitrogen via the rf source is much more complicated than the relatively simple process of evaporating a solid source disposed in a crucible. Lastly, with respect to Group II-VI semiconductors other than ZnSe, p-type doping using nitrogen is relatively untried. As a result, the electrical properties of these nitrogen-doped semiconductor films would be largely unknown.

SUMMARY OF THE INVENTION

The method according to the present invention is useful for growing a p-type doped Group II-VI semiconductor film on a Group II-VI semiconductor structure. According to one aspect of the present invention, the inventive method includes the steps of forming a lattice including a Group II material and a Group VI material and generating a first Group V flux by evaporating a solid Group V source material. The first Group V flux is then decomposed to generate a second Group V flux, which is, in turn, provided to the lattice.

The Group V flux may be decomposed using a cracker cell, which may be a thermal cracker cell having a plurality of baffles. The Group II-VI semiconductor lattice may be formed a temperature in a range from about 150° C. to about 330° C. The lattice may be annealed at a temperature in a range from about 250° C. to about 300° C.

According to another aspect of the present invention, a method of growing a p-type doped Group II-VI semiconductor film includes the steps of forming a lattice including a Group II material and a Group VI material and generating a first elemental arsenic flux. A second elemental arsenic flux is then generated by decomposing the first elemental arsenic flux. The second elemental arsenic flux is then provided to the lattice.

The first elemental arsenic flux may predominantly include tetrameric arsenic and the second elemental arsenic flux may predominantly include dimeric arsenic.

DETAILED DESCRIPTION OF THE INVENTION

Figure 1:
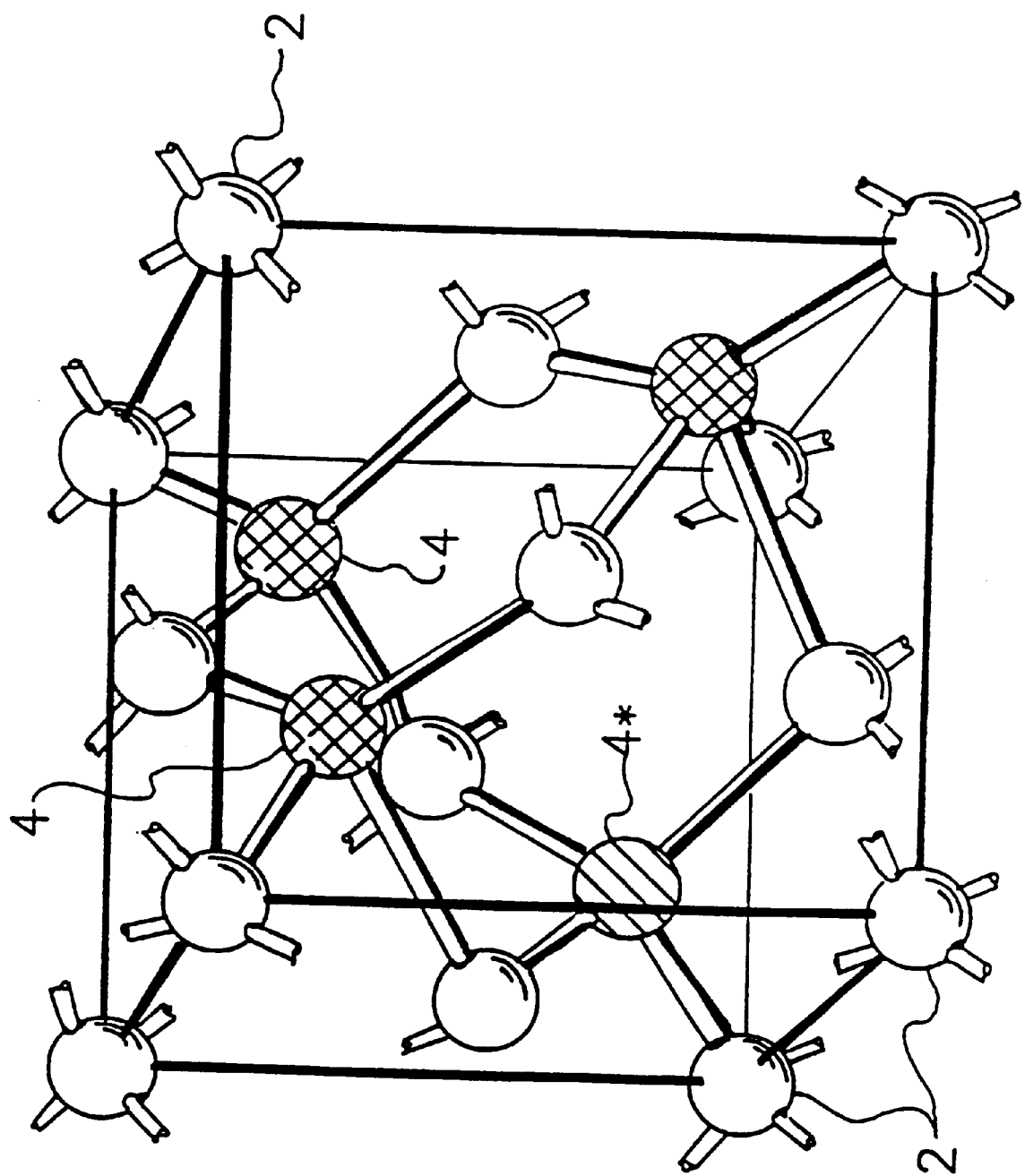
FIG. 1 is a three-dimensional representation of a lattice structure of an MBE-grown Group II-VI material to be p-doped in accordance with the inventive method.

Referring to FIG. 1, conventional molecular beam epitaxy or metal-organic molecular beam epitaxy (collectively referred to as "MBE") has provided the capability of growing films or layers of Group II-VI semiconductor material comprising a lattice having a Group II sublattice and a Group VI sublattice. For example, one Group II-VI semiconductor, HgCdTe, includes a lattice having a basic cubic structure with mercury (Hg) and cadmium (Cd) positioned in a face-centered cube interwoven with another face-centered cube of tellurium (Te). The proportion of mercury and cadmium is substantially equal to the proportion of tellurium, such that HgCdTe is, in actuality, $Hg_{1-x}Cd_xTe$, where x is a fraction of one. Source material selection is one of several controlling factors known to those skilled in the art that determine the proportion of cadmium to mercury. As shown in FIG. 1, the Group VI element (tellurium) occupies sites 2, while the Group II elements (cadmium and mercury) occupy sites 4. A metal vacancy is indicated by a shaded circle at site 4* and generally corresponds with what would be a mercury site.

Although a particular example of a Group II-VI material is described above, the present invention is generally applicable to the growth and doping of numerous other Group II-VI semiconductor materials, including, for example, ZnSe. Any one or more of the following Group II materials, including mixtures thereof, may be used: zinc (Zn), cadmium (Cd), mercury (Hg), and magnesium (Mg). Similarly, the Group VI material may be selected from sulfur (S), selenium (Se), and tellurium (Te), including mixtures thereof. Furthermore, the Group II-VI material may include elements other than Group II and Group VI materials. For example, Group VII elements such as manganese (Mn) can be used to form alloys such as $Hg_{1-x}Mn_xTe$. See Furdyna, J. K., "Diluted magnetic semiconductors: Issues and Opportunities," *J. Vac. Sci. Technol.* A 4(4), July/August 1986, the disclosure of which is incorporated herein by reference. The use of non-Group II-VI materials is limited, of course, to those materials that will not undesirably dope the lattice n-type or p-type.

As will be understood by those skilled in the art, different combinations of the above-identified materials, along with different composition percentages of like-Group materials, will vary the size of the energy bandgap that determines which portion of the infrared spectrum will be detected by the IR detector device fabricated. For example, a long-wave IR detector has been fabricated from an $Hg_{1-x}Cd_xTe$ alloy having x=0.22, while a short-wave IR detector has been fabricated from an $Hg_{1-x}Cd_xTe$ alloy having x=0.75.

Figure 2:
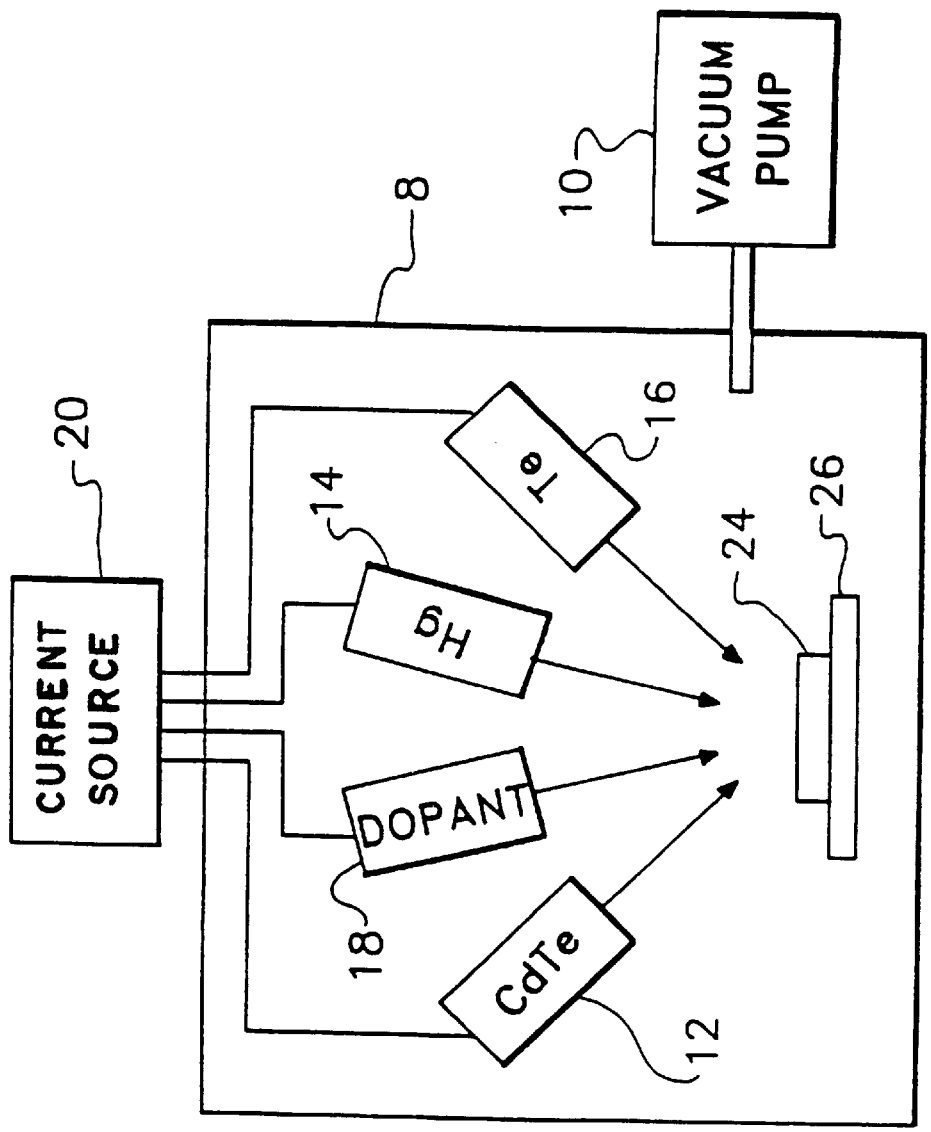
FIG. 2 is a schematic diagram illustrating an MBE apparatus used to practice the inventive method.

Referring now to FIG. 2, a conventional MBE chamber 8 is maintained at a base pressure of about $10^{-10}$ milliBar by a vacuum pump 10. During operation, the background pressure in the MBE chamber 8 (i.e., the pressure in regions other than where the evaporated source materials are directed) remains between approximately $10^{-7}$ milliBar and approximately $10^{-6}$ milliBar. The MBE chamber 8 includes multiple ports for attaching crucibles or other apparatus to provide the evaporated source materials. Each crucible may include a chamber (not shown) for heating or otherwise imparting energy upon a source material.

For example, to grow a p-type doped HgCdTe layer, a first crucible (or effusion cell) 12 contains cadmium telluride (CdTe), a delivery tube/reservoir assembly 14 contains mercury, a second crucible 16 contains tellurium, and a third crucible 18 contains a solid source of an elemental Group V dopant material, which is preferably arsenic (As) or, alternatively, bismuth (Bi) and/or antimony (Sb) and/or phosphorus (P). Each crucible (or reservoir) 12, 14, 16, and 18, may include coils (not shown) carrying current from a current source 20 to heat the chamber or zone of the respective crucible or reservoir and thereby evaporate the source material to generate a vapor flux thereof. Different compounds may form upon heating and/or evaporation of the source material (e.g., CdTe into Cd and $Te_2$). Accordingly, each crucible may also include (or be coupled to) a second zone (e.g., a cracker zone) for decomposition or disassociation of the vapor fluxes. Once again, various forms of energy (thermal, rf, optical, etc.) may be imparted upon the vapor flux in the second zone to accomplish the decomposition. A respective coupling apparatus (not shown) for each crucible (or reservoir) 12, 14, 16, and 18 then provides each of the vapor fluxes to the MBE chamber 8.

The vapor fluxes are directed onto a substrate 24 placed on a platform 26. The substrate 24 may include a CdTe lattice having about 4% of the Group II sites taken up by zinc (Zn), such that the substrate 24 is a CdZnTe alloy. However, the substrate may include one or more buffer or other layers epitaxially grown on a semiconductor support. As will be understood by those skilled in the art, the choice of a substrate (including any specific layers thereof) will depend upon factors such as (i) matching the coefficients of thermal expansion of the substrate and the epitaxially-grown films or layers, and (ii) minimizing the effects of lattice mismatch between the substrate and the epitaxially grown films or layers. The use of a silicon (Si) support, for example, may require an intermediate buffer layer to accommodate the lattice mismatch between silicon and HgCdTe. For some applications, the use of a silicon support preferably adds strength and durability while also reducing production costs.

Figure 3:
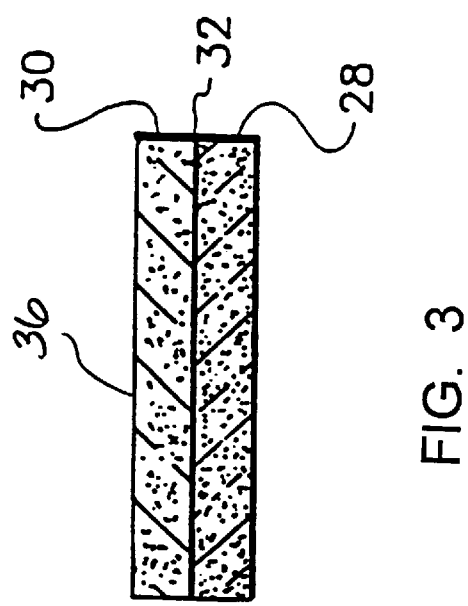
FIG. 3 is a sectional view of a p-n junction formed in accordance with the inventive method.

Referring now to FIG. 3, a simple p-n junction structure implemented by the present invention is illustrated. A base layer 28 of Group II-VI material is first grown on the substrate 24 (FIG. 2), or an associated intermediate layer, and doped by an MBE process. The base layer 28 may be doped n-type through conventional n-type doping techniques using indium (In). Upon the completion of the base layer 28, the dopant type is reversed (i.e., from n-type to p-type), and the MBE process is continued for growth of a p-type cap layer 30, thereby defining a junction 32 and a surface 36. In multilayer heterojunction structures, this nomenclature (i.e., "base layer" and "cap layer") no longer applies, and the layers are simply referred to as either n-type or p-type. The n-type layers and p-type layers in a two color detector may, in general, have thicknesses of about 6 µm to about 10 µm and about 1 µm to about 5 µm, respectively, and may be arranged as an n-p-p-n structure.

A high temperature anneal (e.g., approximately 450° C. or higher) subsequent to the growth of the p-type cap layer 30 is not necessary to activate the dopants. To the extent any annealing is desirable, a low temperature anneal preferably at a temperature in a range from about 200° C. to about 350° C., and most preferably from about 250° C. to about 300° C., is sufficient to perfect the lattice and remove residual metal vacancies 4* and other defects in the Group II sublattice. Annealing the lattice at a low temperature helps avoid the destruction of the junction 32 or other interfaces critical to high performance detectors.

The preferred dopant for the p-type cap layer 30 is arsenic, although other solid source Group V materials such as bismuth, antimony, and phosphorus may be used. The amphoteric nature of these Group V materials has made the growth of suitable p-type cap films troublesome. Growth of p-type films at higher growth temperatures may also be problematic because the sticking coefficient of arsenic and other Group V elements decrease with increasing growth temperatures. However, the crystallinity of the resulting p-type cap layer 30 is also a function of the growth temperature and improves with increasing growth temperatures. Balancing the need for crystallinity against a necessary amount of Group V dopant incorporation results in a preferred growth temperature for each application of the present invention. For example, X-ray diffraction and SIMS data indicate that, while the crystallinity of the p-type cap layer 30 improves by a factor of three (3) if the growth temperature increases from about 145° C. to about 175°, arsenic incorporation decreases by a factor of 100.

To mitigate the effects of this tradeoff, the Group V flux may be modified to optimize the growth conditions for specific device specifications. As will be understood by those skilled in the art, the flux of each particular material is commonly measured via its partial pressure through an ion gauge (not shown) disposed in the MBE chamber 8 near the growth area. Typical partial pressures for each of the relevant fluxes for growth of an HgCdTe layer p-type doped with arsenic fall within the approximate ranges shown in Table 1.

TABLE 1

| Mercury | $1 \times 10^{-4}$–$1 \times 10^{-3}$ milliBar |
| Arsenic | $5 \times 10^{-9}$–$5 \times 10^{-7}$ milliBar |
| Tellurium | $1 \times 10^{-6}$–$5 \times 10^{-6}$ milliBar |
| Cadmium telluride | $8 \times 10^{-7}$–$5 \times 10^{-6}$ milliBar |

In addition, the incorporation of the Group V dopant may be improved by increasing its sticking coefficient in accordance with the present invention, which, in turn, will allow for higher growth temperatures.

Figure 4:
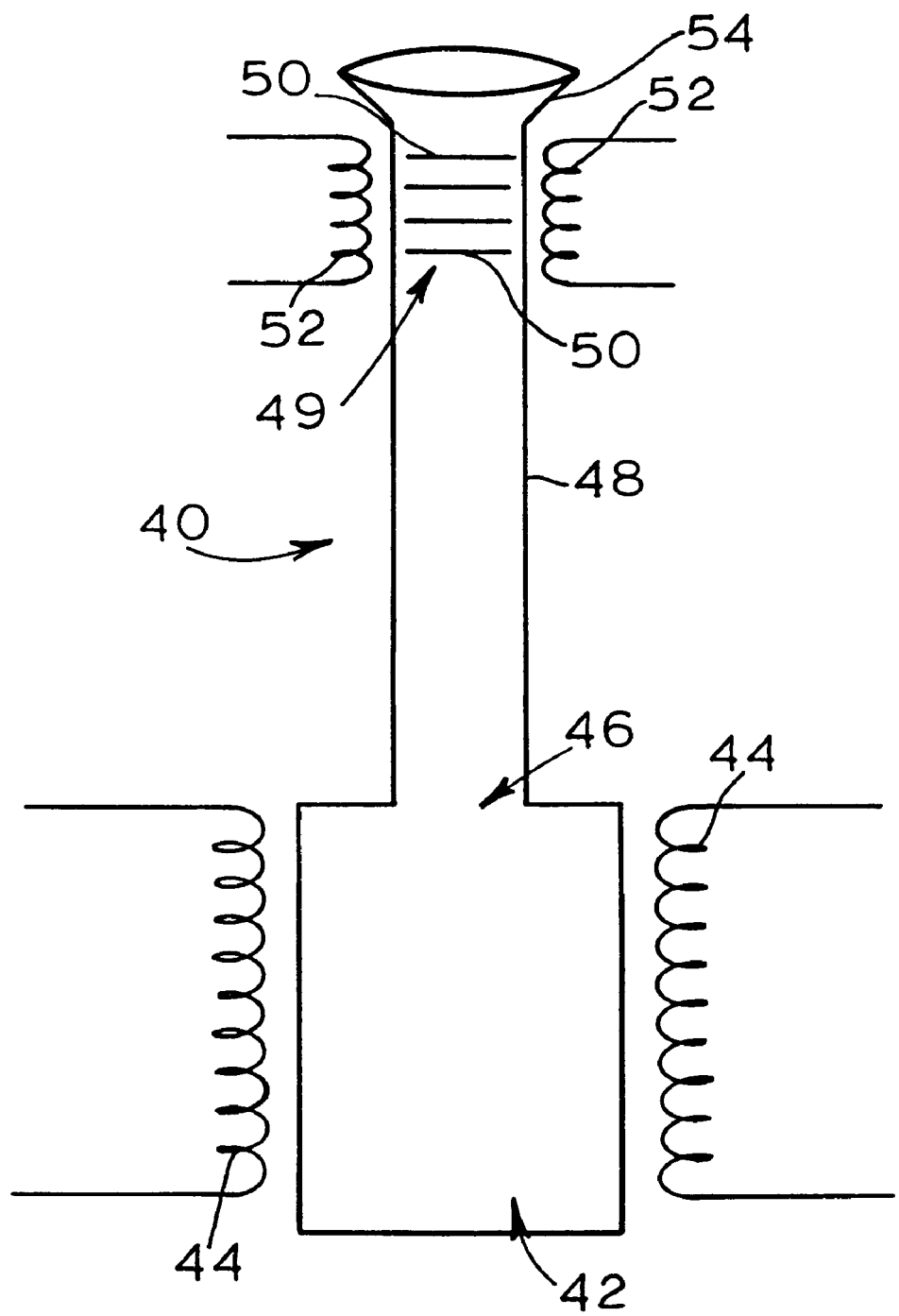
FIG. 4 is a schematic diagram illustrating a cracker cell used in conjunction with the MBE apparatus of FIG. 2 to practice the inventive method.

Referring now to FIG. 4, the sticking coefficient of solid source Group V dopant materials, such as arsenic, for Group II-VI semiconductors has been improved through use of a cracker cell 40 or other energy-imparting vacuum chamber apparatus to decompose the elemental Group V flux generated by mere evaporation of the solid Group V source material. For example, under normal evaporation conditions, such as with the third crucible 18, the arsenic solid source material evaporates into a flux of tetrameric arsenic ($As_4$). The decomposition of tetrameric arsenic into dimeric arsenic ($As_2$) has been accomplished using a cracker cell in the context of growing a different family of semiconductors, namely, Group III-V alloys. See, e.g., J. C. Garcia, et al., "Dimer arsenic source using a high efficiency catalytic cracking oven for molecular beam epitaxy," App. Phys. Lett. 51 (8), p. 593–595 (1987); C. R. Stanley, et al., "Peak electron mobilities between 2.75 and $3.32 \times 10^5$ $v^{-1}s^{-1}$ in GaAs grown by molecular beam epitaxy with $As_2$," App. Phys. Lett. 57(19), p. 1992–1994 (1990).

Alternatively, the sticking coefficient of other Group V materials, such as bismuth, antimony, and phosphorus, may be improved by similar decomposition processing. Under conventional evaporation procedures, bismuth forms a flux of polyatomic bismuth species comprising $Bi_6$ and/or $Bi_8$, antimony forms a flux of polyatomic antimony species comprising $Sb_2$ and/or $Sb_4$, and phosphorus forms a flux of polyatomic phosphorus species comprising $P_2$ and/or $P_4$. Decomposition of these fluxes to generate dimeric and/or monomeric fluxes will greatly improve the sticking coefficient of the respective dopant.

Growing p-type films according to the inventive method utilizes a dramatic improvement in the Group V dopant sticking coefficient effected by the decomposition of the Group V dopant flux. Prior studies comparing the sticking coefficients of different Group V species in the context of growing a different family of semiconductors, the Group III-V alloys, have not predicted such dramatic improvements. For example, the incorporation efficiencies of $As_2$ and $As_4$ have been found to be roughly equal. See Wamsley, C. C., et al., "Solid source molecular beam epitaxy of GaInAsP/InP: Growth mechanisms and machine operation," J. Vac. Sci. Technol. B 14(3), May/June 1996. Moreover, the crystallinity of Group III-V semiconductors grown with $As_4$ was, in fact, found to be slightly better than the semiconductors grown with $As_2$. Similarly, antimony incorporation rates have been found to be approximately the same for monomeric and dimeric antimony in the context of growing Group III-V semiconductors. See Brewer, P. D., "Atomic antimony for molecular beam epitaxy of high quality III-V semiconductor alloys," J. Vac. Sci. Technol. B 14(3), May/June 1996.

In accordance with the method of the present invention, the cracker cell 40, which may comprise a conventional thermal cracker cell, includes a first zone 42 having a solid elemental Group V source material (not shown) disposed therein for evaporation. In one embodiment, the first zone 42 is surrounded by sets of heating coils 44 designed to elevate the first zone 42 to a temperature preferably in a range from about 180° C. to about 300° C., more preferably in a range from about 220° C. to about 280° C., and most preferably in a range from about 240° C. to about 260° C. As stated above, this evaporation step generates a first elemental Group V flux that predominantly includes, or consists essentially of, tetrameric arsenic or, alternatively, dimeric and/or tetrameric antimony, $Bi_6$ and/or $Bi_8$, or dimeric and/or tetrameric phosphorus. The first elemental Group V flux exits the first zone 42 through an orifice 46 into a conduit 48. In one embodiment, the conduit 48 terminates in a second zone 49 having multiple baffles 50 disposed therein. Each baffle 50 has a plurality of apertures (not shown) staggered in position from the plurality of apertures in either adjacent disk to prevent a line-of-sight approach to the MBE chamber 8, but to permit the eventual passage of the elemental Group V material. Consequently, each arsenic tetramer or other undecomposed Group V species impinges upon one or more of the baffles 50 before leaving the second zone 49.

Each baffle 50 comprises a heated disk maintained by one or more sets of heating coils 52 at a temperature preferably in a range from about 400° C. to about 1200° C., more preferably in a range from about 500° C. to about 1000° C., and most preferably in a range from about 650° C. to about 900° C. In the case of arsenic, depending on the temperature of the baffles 50, the first elemental arsenic flux of tetrameric arsenic decomposes upon impingement into a second elemental arsenic flux comprising either dimeric and/or monomeric arsenic. The second elemental arsenic flux may also include undecomposed tetrameric arsenic if the temperature of the second zone is sufficiently low (see FIG. 6 and Table 1). Lastly, the second elemental arsenic flux flows past the second zone 49 to enter an end portion 54 shaped to couple the cracker cell 40 to a port (not shown) in the MBE apparatus leading to the MBE chamber 8.

Alternatively, the first elemental Group V flux comprises antimony species which decompose into a second elemental Group V flux comprising monomeric and/or dimeric antimony. With respect to a first elemental Group V flux of bismuth species, decomposition would form a second elemental Group V flux comprising monomeric, dimeric, and/or tetrameric bismuth. Lastly, a first elemental Group V flux of phosphorus species would decompose into a second elemental Group V flux comprising monomeric and/or dimeric phosphorus.

A variety of different cracker cells known to those skilled in the art may be used to decompose the first elemental Group V flux. For instance, both photolytic and rf-assisted cracking cells may be used instead of the thermal cracking cell described above. In short, the source or type of energy imparted upon the first elemental Group V flux is not critical to the implementation of the inventive method.

When using the (thermal) cracker cell 40 described above, the temperature of the second zone 49 becomes one of several factors determinative of the amount of arsenic or other Group V dopant incorporation. For example, FIG. 5 and Table 2 show the dramatic increases in arsenic incorporation with increasing cracker cell temperatures in the second zone 49.

TABLE 2

| Second Zone Temp. (° C.) | As Concentration (cm$^{-3}$) |
|---|---|
| 600 | $7 \times 10^{17}$ |
| 700 | $2 \times 10^{19}$ |
| 800 | $4 \times 10^{20}$ |
| 850 | $1 \times 10^{21}$ |

Figure 5:
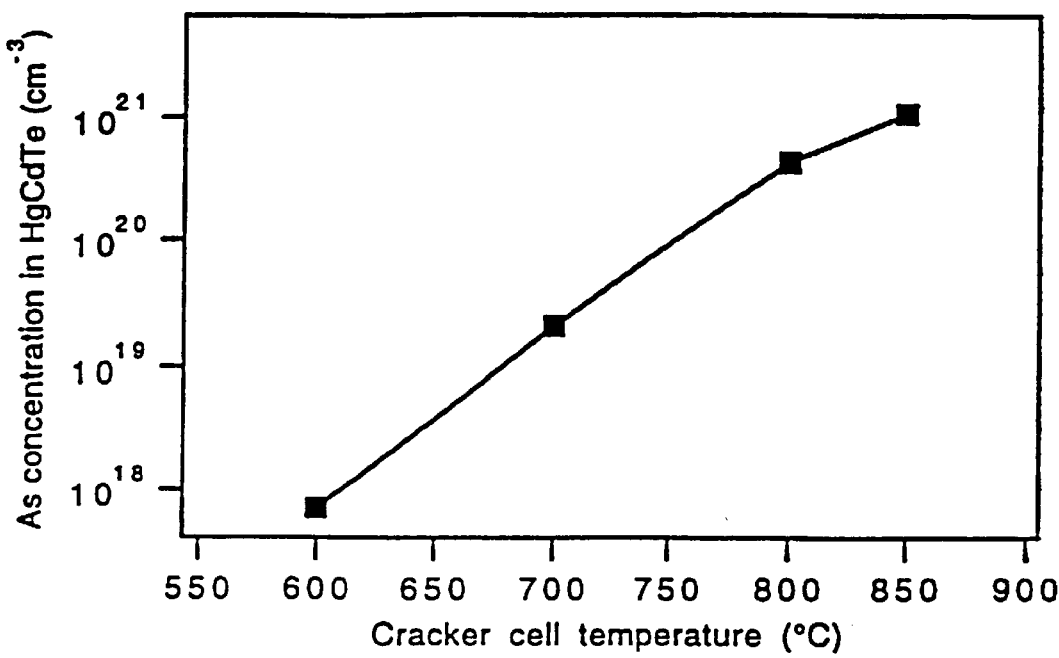
FIG. 5 is a graph illustrating the arsenic concentration of p-type films grown in accordance with the inventive method as a function of cracker cell temperature.

The results shown in FIG. 5 and Table 1 were obtained with an arsenic partial pressure of $7.0 \times 10^{-7}$ milliBar, a mercury partial pressure of $1 \times 10^{-4}$ milliBar, a tellurium partial pressure of $2 \times 10^{-6}$ milliBar, and a cadmium telluride partial pressure of $1 \times 10^{-6}$ milliBar at a growth temperature of 150° C.

Figure 6:
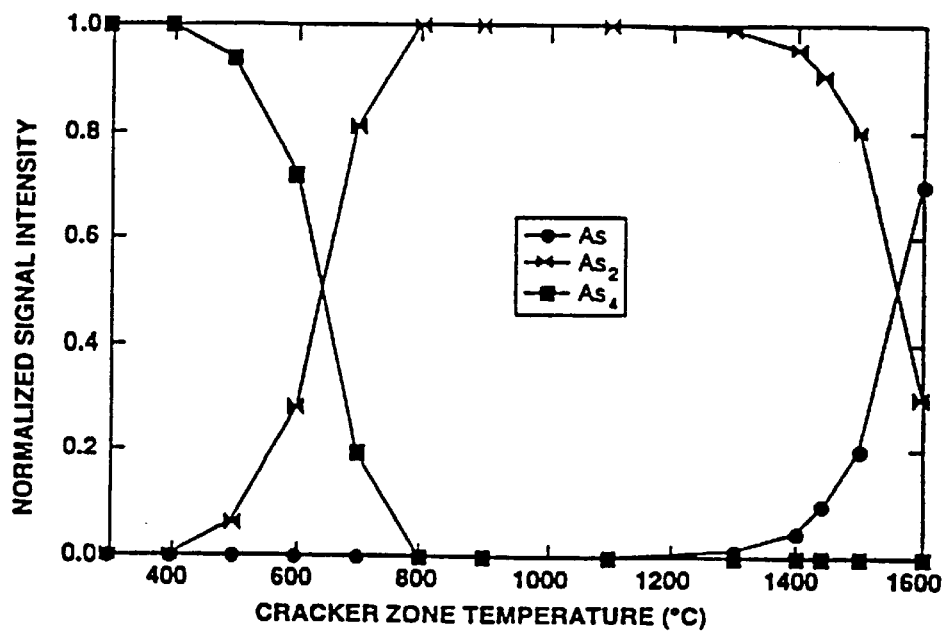
FIG. 6 is a graph illustrating arsenic flux compositions as a function of cracker cell temperature.

The increases in arsenic concentration shown in FIG. 5 and Table 2 are believed to be a result of the composition of the second elemental arsenic flux. FIG. 6 and Table 3 illustrate how the composition of the second elemental arsenic flux is a function of the temperature of the second zone 49 of the cracker cell 40. As shown, decomposition of tetrameric arsenic begins at a temperature of about 400° C., wherein an increasing amount of dimeric arsenic is generated until the second elemental arsenic flux consists essentially of dimeric arsenic at about 800° C. At temperatures in excess of about 1300° C., the second elemental arsenic flux begins to include a significant amount of monomeric arsenic.

TABLE 3

| Second Zone Temp. (° C.) | Relative Abundance (%) | | |
|---|---|---|---|
| | As | As$_2$ | As$_4$ |
| 400 | 0 | 0 | 100 |
| 500 | 0 | 5 | 95 |
| 600 | 0 | 30 | 70 |
| 700 | 0 | 80 | 20 |
| 800 | 0 | 100 | 0 |
| 900 | 0 | 100 | 0 |
| 1100 | 0 | 100 | 0 |
| 1300 | 2 | 98 | 0 |
| 1400 | 5 | 95 | 0 |
| 1450 | 10 | 90 | 0 |
| 1500 | 20 | 80 | 0 |
| 1600 | 70 | 30 | 0 |

The results shown in FIG. 6 and Table 3 were obtained through time-of-flight mass spectrometric studies.

Alternatively, the Group V dopant flux may be initially generated such that the Group V material is initialized, vaporized, or otherwise generated in dimeric and/or monomeric form. The present invention is not limited to processes involving a decomposition or disassociation step, because the dimeric or monomeric flux may be generated initially if sufficient energy is applied to the Group V source material. Moreover, the energy may be imparted in any known manner, including optically (via lenses), thermally, and via microwave or other radiation.

Figure 7:
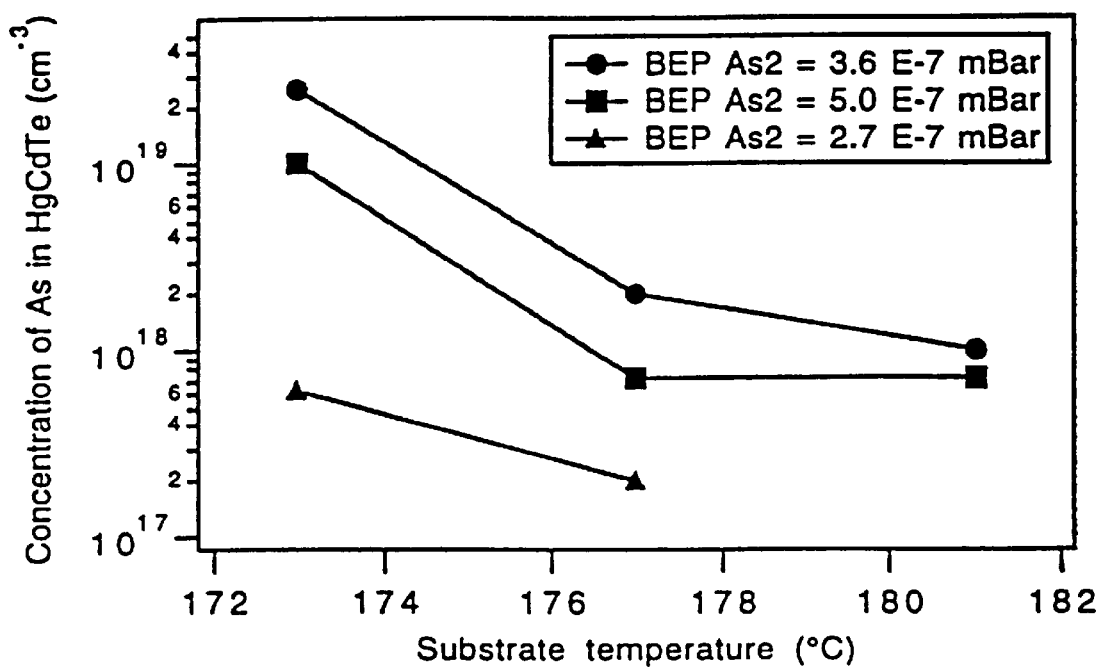
FIG. 7 is a graph illustrating arsenic concentrations of p-type films grown in accordance with the inventive method as a function of growth temperature and arsenic pressure.

The fabrication of high performance p-on-n, n-p-n, and n-p-p-n HgCdTe IR detectors has generally required the p-type cap layer 30 or the p-type film to have approximate arsenic concentrations from $1 \times 10^{17}$ to $1 \times 10^{18}$ cm$^{-3}$. Other process parameters, such as the relative flux ratios (particularly the Hg:Te flux ratio), may modify the minimum second zone temperature. In general, however, to achieve an arsenic concentration of $1 \times 10^{17}$ cm$^{-3}$ at a growth temperature of about 170° C., the temperature of the second zone 49 of the cracker cell 40 need not exceed about 700° C. Arsenic concentration data as a function of the growth temperature and arsenic partial pressure are shown in FIG. 7 and Table 4.

TABLE 4

| As$_2$ Pressure (milliBar) | Growth Temp. (° C.) | As Concentration (cm$^{-3}$) |
|---|---|---|
| $2.7 \times 10^{-7}$ | 173 | $6 \times 10^{17}$ |
| $2.7 \times 10^{-7}$ | 177 | $2 \times 10^{17}$ |
| $3.6 \times 10^{-7}$ | 173 | $2.5 \times 10^{19}$ |
| $3.6 \times 10^{-7}$ | 177 | $2.0 \times 10^{18}$ |
| $3.6 \times 10^{-7}$ | 181 | $1.0 \times 10^{18}$ |
| $5.0 \times 10^{-7}$ | 173 | $1.0 \times 10^{19}$ |
| $5.0 \times 10^{-7}$ | 177 | $7 \times 10^{17}$ |
| $5.0 \times 10^{-7}$ | 181 | $7 \times 10^{17}$ |

The above results were obtained under the following other approximate process conditions:

First zone temp. 250° C.
Second zone temp. 800° C.
Mercury Pressure 2×10$^{-4}$ milliBar
Arsenic Pressure 1×10$^{-7}$ milliBar
Tellurium Pressure 2×10$^{-6}$ milliBar
CdTe Pressure 1×10$^{-6}$ milliBar EPD (etch pitch density) measurements have confirmed that devices, such as n-p-n multispectral detectors, fabricated in accordance with the inventive method have improved crystallinity, which is critical for reducing the dark (i.e., leakage) current in IR detectors. Although the invention is not limited by any particular mechanism, the improvement is believed to be a result of growing the HgCdTe layers at more favorable growth temperatures, such as in a preferred range from about 160° C. to about 220° C., more preferably in a range from about 170° C. to about 190° C., and most preferably in a range from about 170° C. to about 185° C. Growth at such temperatures is made possible by the improved arsenic sticking coefficient provided by the inventive method. In general, the growth temperature may range from about 150° C. to about 330° C. for Group II-VI semiconductors other than HgCdTe.

As shown in the examples provided below, a comparison of p-type HgCdTe films grown according to the inventive method with films grown with conventional arsenic evaporation has shown dramatic increases in the arsenic sticking coefficient. The following examples also show the performance and structural characteristics of IR detectors fabricated in accordance with the inventive method.

EXAMPLE 1

A p-type HgCdTe film was grown on a (211) B CdZnTe substrate under the following approximate process conditions:

Growth temp. 155° C.
First zone temp. 250° C.
Second zone temp. 800° C.
Mercury Pressure 2×10$^{-4}$ milliBar
Arsenic Pressure 1×10$^{-4}$ milliBar
Tellurium Pressure 2×10$^{-6}$ milliBar
CdTe Pressure 1×10$^{-6}$ milliBar As a result of the use of the cracker cell 40, the p-type film had an approximate arsenic concentration of 5×10$^{21}$ cm$^{-3}$. The arsenic concentration was determined by secondary ion mass spectroscopy (SIMS) measurements.

For comparison, a parallel process run was then conducted in which the conventional effusion cell 14 (FIG. 1) was used instead of the cracker cell 40. Holding all other process variables constant, the resulting HgCdTe layer had an arsenic concentration of about 1×10$^{18}$ cm$^{-3}$. Consequently, the dimeric arsenic produced by the cracker cell 40 may exhibit a sticking coefficient as much as 5000 times higher than that of the tetrameric arsenic.

EXAMPLE 2

An n-p-n sequential IR detector designed to detect 8 μm and 11 μm radiation included a p-type HgCdTe film that was fabricated in accordance with the inventive method. The p-type HgCdTe film of the detector was grown on a (211) B CdZnTe substrate under the following approximate process conditions:

Growth temp. 170° C.
First zone temp. 250° C.
Second zone temp. 800° C.
Mercury Pressure 2×10$^{-4}$ milliBar
Arsenic Pressure 1×10$^{-7}$ milliBar
Tellurium Pressure 2×10$^{-6}$ milliBar
CdTe Pressure 1×10$^{-6}$ milliBar Through SIMS and EPD analyses, the arsenic concentration in the p-type film was determined to be approximately 1×10$^{17}$ cm$^{-3}$ and the near surface EPD in the 15 μm thick structure was measured at 1.4×10$^6$ cm$^{-2}$.

Figure 8:
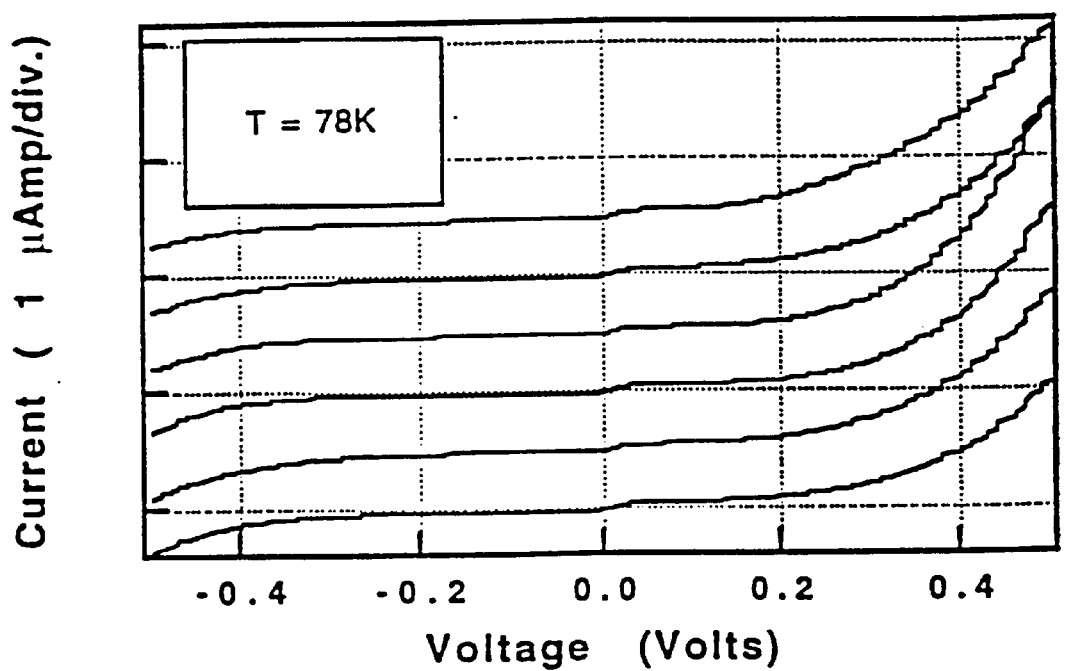
FIG. 8 is a graph illustrating I-V characteristics of six different n-p-n sequential IR detectors fabricated in accordance with the inventive method.
Figure 9:
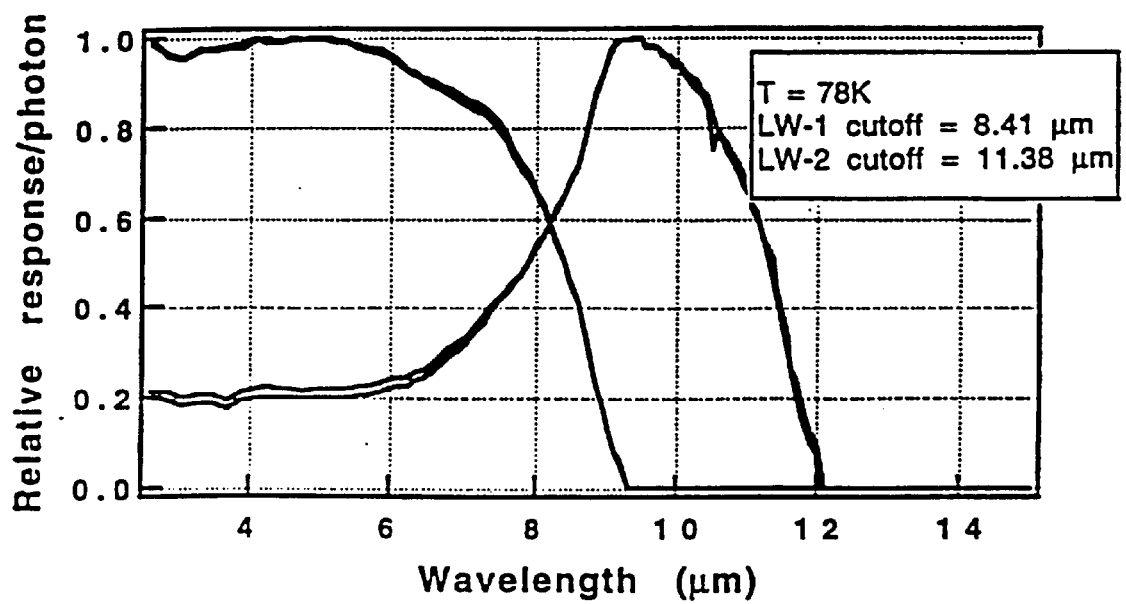
FIG. 9 is a graph illustrating a spectral response characteristic of a detector fabricated in accordance with the inventive method.

The n-p-n sequential IR detector was tested after processing into a mesa diode structure and hybridization to a fan-out. As shown is FIGS. 8 (which depicts six different detectors) and 9, respectively, the device exhibited excellent I-V and spectral response characteristics at an operating temperature of 78 K. FIG. 8 shows a different curve for each of the 6 detectors, with the curves being offset from one another for clarity, and with zero on the y-axis being at the intersections of each curve and the vertical division line at 0.0 volts. The device had cutoff wavelengths of 8.41 μm and 11.38 μm and exhibited $R_dA$ (dynamic resistance and diode area product) values of 1.01×10$^3$ Ωcm$^2$ and 127 Ωcm$^2$.

Numerous modifications and alternative embodiments of the invention will be apparent to those skilled in the art in view of the foregoing description. Accordingly, this description is to be construed as illustrative only and is for the purpose for teaching those skilled in the art the best mode of carrying out the invention. The details of the structure may be varied substantially without departing from the spirit of the invention, and the exclusive use of all modifications which are within the scope of the appending claims is reserved.

What is claimed is:

1. A method of growing a p-type doped Group II-VI semiconductor film, comprising the steps of:
   (a) forming a lattice comprising a Group II material and a Group VI material;
   (b) generating a first Group V flux by evaporating a solid Group V source material;
   (c) decomposing the first Group V flux to generate a second Group V flux, wherein step (c) comprises the step of utilizing a thermal cracker cell having a plurality of baffles; and
   (d) providing the second Group V flux to the lattice during step (a).

2. The method of claim 1, wherein step (a) comprises:
   generating a Group II flux by evaporation; and
   generating a Group VI flux by evaporation.

3. The method of claim 1, wherein step (b) comprises evaporating elemental arsenic and wherein the Group II material is mercury and the Group VI material is tellurium.

4. The method of claim 3, further comprising the steps of:
   generating a cadmium telluride flux by evaporation; and
   providing the cadmium telluride flux to the lattice.

5. The method of claim 1, wherein step (a) occurs at a temperature in a range from about 150° C. to about 330° C.

6. The method of claim 1, wherein the first Group V flux consists essentially of tetrameric arsenic and the second Group V flux consists essentially of dimeric arsenic.

7. The method of claim 1, further comprising the step of annealing the lattice at a temperature in a range from about 250° C. to about 300° C.

8. A method of growing a p-type doped Group II-VI semiconductor film, comprising the steps of:
   (a) forming a lattice comprising cadmium, a Group II material having mercury, and a Group VI material having tellurium;

(b) generating a first elemental arsenic flux;

(c) generating a second elemental arsenic flux by decomposing the first elemental arsenic flux; and (d) providing the second elemental arsenic flux to the lattice during step (a).

9. The method of claim 8, wherein the first elemental flux consists essentially of tetrameric arsenic.

10. The method of claim 9, wherein the second elemental flux consists essentially of dimeric arsenic.

11. The method of claim 8, wherein step (c) comprises:

heating a set of baffles to a temperature from about 400° C. to about 1000° C.; and applying the first elemental arsenic flux to the baffles.

12. The method of claim 8, wherein step (a) occurs at a temperature in a range from about 160° C. to about 220° C.

13. The method of claim 8, further comprising the step of annealing the lattice at a temperature in a range from about 250° C. to about 300° C.

14. A method of growing a p-type doped Group II-VI semiconductor film, comprising the steps of:

(a) forming a lattice comprising a Group II material and a Group VI material;

(b) generating an elemental Group V flux comprising at least one of a dimeric Group V flux and a monomeric Group V flux by imparting energy on a solid source of elemental Group V material, wherein step (b) comprises the steps of evaporating the solid source of elemental Group V material to form a Group V tetramer flux and decomposing the Group V tetramer flux in a cracker cell having a plurality of baffles; and (c) providing the elemental Group V flux to the lattice during step (a).

15. The method of claim 14, wherein the Group V material is arsenic.

16. The method of claim 14, further comprising the step of annealing the lattice at a temperature in a range from about 250° C. to about 300° C.

17. A method of growing a p-type doped, Group II-VI semiconductor film for a narrow bandgap semiconductor, comprising the steps of:

(a) forming a lattice comprising a Group II material and a Group VI material;

(b) generating a first Group V flux by evaporating a solid Group V source material, the first Group V flux substantially comprising tetramers;

(c) decomposing the first Group V flux to generate a second Group V flux, wherein the second Group V flux substantially comprises dimers that are characterized by a sticking coefficient as much as about 5000 times higher than a sticking coefficient associated with the tetramers;

(d) providing the second Group V flux to the forming lattice; and (e) annealing the lattice at a temperature that is less than about 450° C.

18. The method of claim 17 wherein said semiconductor comprises Hg.

19. The method of claim 18, wherein said semiconductor further comprises HgCdTe.

* * * * *